United States Patent
Uno et al.

(10) Patent No.: US 12,334,467 B2
(45) Date of Patent: Jun. 17, 2025

(54) COPPER BONDING WIRE

(71) Applicants: NIPPON MICROMETAL CORPORATION, Saitama (JP); NIPPON STEEL Chemical & Material Co., Ltd., Tokyo (JP)

(72) Inventors: Tomohiro Uno, Tokyo (JP); Tetsuya Oyamada, Tokyo (JP); Daizo Oda, Saitama (JP); Kota Shimomura, Saitama (JP); Tadashi Yamaguchi, Saitama (JP)

(73) Assignees: NIPPON MICROMETAL CORPORATION, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 383 days.

(21) Appl. No.: 17/798,833

(22) PCT Filed: Feb. 19, 2021

(86) PCT No.: PCT/JP2021/006431
§ 371 (c)(1),
(2) Date: Aug. 10, 2022

(87) PCT Pub. No.: WO2021/167083
PCT Pub. Date: Aug. 26, 2021

(65) Prior Publication Data
US 2023/0105851 A1 Apr. 6, 2023

(30) Foreign Application Priority Data
Feb. 21, 2020 (JP) ................................. 2020-028560

(51) Int. Cl.
*H01L 23/00* (2006.01)
*G01N 23/2273* (2018.01)

(52) U.S. Cl.
CPC ......... *H01L 24/45* (2013.01); *G01N 23/2273* (2013.01); *H01L 2224/45005* (2013.01); *H01L 2224/45139* (2013.01); *H01L 2224/45147* (2013.01); *H01L 2224/45164* (2013.01); *H01L 2224/45169* (2013.01); *H01L 2224/45173* (2013.01); *H01L 2224/45187* (2013.01); *H01L 2924/37002* (2013.01)

(58) Field of Classification Search
None
See application file for complete search history.

(56) References Cited

U.S. PATENT DOCUMENTS

| | | | |
|---|---|---|---|
| 2008/0061440 A1* | 3/2008 | Uno | H01L 24/85 257/762 |
| 2017/0125135 A1 | 5/2017 | Amano et al. | |
| 2017/0154863 A1* | 6/2017 | Sarangapani | H01L 24/45 |
| 2018/0082977 A1 | 3/2018 | Yagyu | |
| 2020/0168578 A1 | 5/2020 | Oyamada et al. | |
| 2020/0279824 A1* | 9/2020 | Oyamada | H01L 24/45 |

FOREIGN PATENT DOCUMENTS

| | | | |
|---|---|---|---|
| JP | S60224237 A | 11/1985 | |
| JP | S6148543 A | 3/1986 | |
| JP | 2013-138125 A | 7/2013 | |
| JP | 2018503743 A | 2/2018 | |
| JP | 2018046242 A | 3/2018 | |
| SG | 191705 A | 8/2013 | |
| TW | 201314806 A * | 4/2013 | ............... C22C 9/00 |
| TW | 201921531 A | 6/2019 | |
| WO | 2013099413 A1 | 7/2013 | |
| WO | 2017221770 A1 | 12/2017 | |
| WO | 2019/031497 A1 | 2/2019 | |

OTHER PUBLICATIONS

Extended European Search Report issued in corresponding European Patent Application No. 21757478.9, dated Sep. 27, 2023.
Office Action dated May 21, 2024 from corresponding Taiwan Patent Application No. 110105710, 10 pages.
International Search Report and Written Opinion of PCT/JP2021/006431 mailed May 25, 2021, with English Translation.
Office Action dated Mar. 18, 2025, in corresponding Korean Patent Application No. 10-2022-7028062, 10 pages.

* cited by examiner

*Primary Examiner* — Nishath Yasmeen
(74) *Attorney, Agent, or Firm* — Rimon P.C.

(57) ABSTRACT

There is provided a copper bonding wire that exhibits a favorable bondability even when a scrub at the time of bonding is reduced. The copper bonding wire is characterized in that when a sum of percentages of Cu, $Cu_2O$, CuO and $Cu(OH)_2$ on a surface of the wire as measured by X-ray Photoelectron Spectroscopy (XPS) is defined as 100%, Cu[II]/Cu[I] which is a ratio of a total percentage of CuO and $Cu(OH)_2$ (Cu[II]) corresponding to bivalent Cu to a percentage of $Cu_2O$ (Cu[I]) corresponding to monovalent Cu falls within a range from 0.8 to 12.

7 Claims, No Drawings

COPPER BONDING WIRE

CROSS-REFERENCE OF RELATED APPLICATIONS

This application is the U.S. National Phase under 35 U.S.C. § 371 of International Patent Application No. PCT/JP2021/006431, filed on Feb. 19, 2020, which in turn claims the benefit of Japanese Patent Application No. 2020-028560, filed on Feb. 21, 2020, the entire disclosures of which Applications are incorporated by reference herein.

TECHNICAL FIELD

The present invention relates to a copper bonding wire.

BACKGROUND ART

In semiconductor devices, electrodes formed on a semiconductor chip are connected with electrodes on a lead frame or a substrate using a bonding wire. Conventionally, gold (Au) has been the common material of bonding wires but research and development related to copper (Cu) as an alternative thereto have been carried out particularly in the LSI applications (for example, Patent Literatures 1 to 3). There has been a growing demand for replacement with Cu also in the power semiconductor applications since Cu has high efficiency and high reliability due to its high thermal conductivity and high fusing current characteristic

RELATED ART REFERENCE

Patent Literature

Patent Literature 1: JP S61-48543 A
Patent Literature 2: JP 2018-503743 T
Patent Literature 3: WO 2017/221770

SUMMARY OF INVENTION

Problem to be Solved by the Invention

In a mounting process using a copper bonding wire (hereinafter, also simply referred to as a "copper wire") in mass production, there is the problem that a special bonding condition is required because a bondability is low, which retards expansion of practical use thereof.

In wedge bonding where a copper wire is bonded to an electrode on a substrate, the resulted bonding strength tends to be low. Thus, as a method of improving the bondability of the copper wire, there is often used a scrub function that horizontally moves a capillary or a sample stage multiple times at a low frequency at the time of bonding. In bonding of a typical bonding wire, ultrasonic vibrations (60 to 120 kHz) are used. However, in bonding of a conventional copper wire, the scrub function is used in addition to ultrasonic vibrations because bonding cannot be sufficiently performed with only ultrasonic vibrations. As for a moving direction of a scrub, a direction parallel to a wire direction is typically used, but a circular arc motion with respect to the wire direction (a combination of a parallel direction and a direction perpendicular to the parallel direction) is used in some cases.

Due to this scrub function, there are caused problems such that a bonding time is prolonged and productivity is lowered, or a disturbance in a loop shape is caused, for example. The scrub is a special bonding condition that has not been used for a conventional gold wire. Even with the copper wire, productivity can be improved if the number of times of the scrub can be reduced or the movement amount of the scrub can be reduced, which contributes to expansion of practical use of the copper wire.

An object of the present invention is to provide a copper bonding wire that exhibits a favorable bondability even when the scrub is reduced at the time of bonding.

Means for Solving Problem

As a result of earnest investigation as to the problem described above, the present inventors have found that the problem described above can be solved by the copper bonding wire having the configuration described below, and have completed the present invention.

That is, the present invention includes the following content.

[1] A copper bonding wire wherein, when a sum of percentages of Cu, $Cu_2O$, CuO and $Cu(OH)_2$ on a surface of the wire as measured by X-ray Photoelectron Spectroscopy (XPS) is defined as 100%, Cu[II]/Cu[I] which is a ratio of a total percentage of CuO and $Cu(OH)_2$ (Cu[II]) corresponding to bivalent Cu to a percentage of $Cu_2O$ (Cu[I]) corresponding to monovalent Cu falls within a range from 0.8 to 12.

[2] The copper bonding wire according to [1], wherein $[Cu(OH)_2]/[CuO]$ which is a ratio of a percentage of $Cu(OH)_2$ [$Cu(OH)_2$] to a percentage of CuO [CuO], measured by the X-ray Photoelectron Spectroscopy (XPS), falls within a range from 1 to 5.5.

[3] The copper bonding wire according to [1] or [2], wherein $[CuO]/[Cu_2O]$ which is a ratio of a percentage of CuO [CuO] to a percentage of $Cu_2O$ [$Cu_2O$], measured by the X-ray Photoelectron Spectroscopy (XPS), falls within a range from 0.3 to 6.

[4] The copper bonding wire according to any one of [1] to [3], wherein a sum of the Cu[I] and the Cu[II] is 50% or more.

[5] The copper bonding wire according to any one of [1] to [4], containing one or more selected from the group consisting of Pd, Pt, Ag and Rh, and a total concentration thereof is from 100 to 6000 ppm by mass.

[6] The copper bonding wire according to any one of [1] to [5], wherein a diameter of the wire is 15 μm or more and 100 μm or less.

[7] The copper bonding wire according to any one of [1] to [6] which is usable for a semiconductor device.

Effect of the Invention

The present invention can provide a copper bonding wire that exhibits a favorable bondability even when the scrub is reduced at the time of bonding.

EMBODIMENT FOR CARRYING OUT THE INVENTION

Hereinafter, the present invention will be described in detail based on a preferred embodiment thereof.

[Copper Bonding Wire]

A copper bonding wire according to the present invention is characterized in that when a sum of percentages of Cu, $Cu_2O$, CuO and $Cu(OH)_2$ on a surface of the wire as measured by X-ray Photoelectron Spectroscopy (XPS) is defined as 100%, Cu[II]/Cu[I] which is a ratio of a total percentage of CuO and $Cu(OH)_2$ (Cu[II]) corresponding to bivalent Cu to a percentage of $Cu_2O$ (Cu[I]) corresponding to monovalent Cu falls within a range from 0.8 to 12.

By measuring a surface of the copper wire with using X-ray Photoelectron Spectroscopy (XPS), a chemical-bonding state of a copper (Cu) element present in the vicinity of the surface of the copper wire (normally, an analytical depth is about several nanometers) can be analyzed. The present inventors have found that the chemical-bonding state (charge state) of the Cu element on the surface of the copper wire correlates with a characteristic of the copper wire, and have implemented the copper wire that exhibits an expected characteristic by controlling the chemical-bonding state of the Cu element.

The present inventors have found that, in association with characteristics of the copper wire including a bondability at the time of a low scrub, a percentage of Cu substances in chemical-bonding states of Cu, $Cu_2O$, CuO and $Cu(OH)_2$ as measured by X-ray Photoelectron Spectroscopy (XPS) is important. The Cu substance in the chemical-bonding state of Cu corresponds to a Cu element in a metal state (zero-valent Cu).

In the present invention, the percentages of Cu substances in the chemical-bonding states of Cu, $Cu_2O$, CuO and $Cu(OH)_2$ as measured by X-ray Photoelectron Spectroscopy (XPS) are simply referred to as "percentages of Cu, $Cu_2O$, CuO and $Cu(OH)_2$ as measured by X-ray Photoelectron Spectroscopy (XPS)".

When the sum of the percentages of Cu, $Cu_2O$, CuO and $Cu(OH)_2$ as measured by X-ray Photoelectron Spectroscopy (XPS) is defined as 100%, Cu[II]/Cu[I] which is the ratio of the total percentage of CuO and $Cu(OH)_2$ (Cu[II]) corresponding to bivalent Cu to the percentage of $Cu_2O$ (Cu[I]) corresponding to monovalent Cu falls within a range from 0.8 to 12. Accordingly, it is possible to achieve the copper wire that exhibits a favorable bondability at the time of bonding even when the scrub is reduced.

Herein, as described above, the percentage of $Cu_2O$ (Cu[I]) corresponding to the monovalent Cu indicates the percentage of Cu substances in the chemical-bonding state of $Cu_2O$ when the sum of percentages of the Cu substances in the chemical-bonding states of Cu, $Cu_2O$, CuO and $Cu(OH)_2$ as measured by X-ray Photoelectron Spectroscopy (XPS) is defined as 100%.

Similarly, as described above, the total percentage of CuO and $Cu(OH)_2$ (Cu[II]) corresponding to the bivalent Cu indicates the sum of percentage of Cu substances in the chemical-bonding states of CuO and $Cu(OH)_2$ when the sum of percentages of the Cu substances in the chemical-bonding states of Cu, $Cu_2O$, CuO and $Cu(OH)_2$ as measured by X-ray Photoelectron Spectroscopy (XPS) is defined as 100%.

By measuring the surface of the copper bonding wire with using XPS, the monovalent Cu and the bivalent Cu present on the surface of the copper wire can be identified with high accuracy, and concentration thereof can be calculated. By controlling the ratio of the bivalent Cu to the monovalent Cu obtained in the XPS measurement, it is possible to achieve the copper wire that exhibits a favorable bondability even when the scrub at the time of bonding is reduced. As a conventional analysis method for analyzing a surface of a thin copper wire having a diameter of about 10 to 100 μm, Auger spectroscopy (AES), a secondary electron microscope (SEM), a transmission electron microscope (TEM), and the like have been conventionally used. However, with these methods, it has been difficult to measure the chemical-bonding state of the Cu element on the surface of the copper wire and accurately analyze a Cu substance in a specific chemical-bonding state. The present inventors have performed analysis with using the AES and the TEM on surfaces of some copper wires, and have confirmed that a characteristic of the surface of the copper wire specified by these methods, a bonding characteristic of the copper wire, especially the bondability at the time of a low scrub which is the problem to be solved in the present invention do not necessarily correlate with each other. On the other hand, the present inventors have found that the copper wire manufactured by controlling the ratio of the bivalent Cu to the monovalent Cu obtained in the XPS measurement can stably achieve a favorable bondability even when the scrub at the time of bonding is reduced, and then can achieve a stable mass productivity.

Hereinafter, a condition related to the ratio Cu[II]/Cu[I] is also referred to as a "Condition 1".

In view of achieving a copper wire having more excellent bondability at the time of low scrub, the percentage of the bivalent Cu present in the vicinity of the surface of the copper wire is preferably increased as compared with the percentage of the monovalent Cu. A lower limit of the ratio Cu[II]/Cu[I] is preferably 0.9 or more, more preferably 1 or more, and further preferably 1.2 or more, 1.4 or more, 1.5 or more, 1.6 or more, 1.8 or more, 2 or more, 2.2 or more, 2.4 or more, 2.5 or more, 2.6 or more, 2.8 or more, or 3 or more. It is estimated that such an effect is influenced by that a protective function of the surface of the copper wire is enhanced by the bivalent Cu (Cu substance corresponding thereto), and that the proceeding of oxidation may be suppressed by controlling the monovalent Cu.

In view of achieving a copper wire having a more excellent bondability at the time of a low scrub, an upper limit of the ratio Cu[II]/Cu[I] is preferably 11.5 or less, more preferably 10 or less, and further preferably 9.5 or less, 9 or less, 8.5 or less, 8 or less, 7.5 or less, or 7 or less.

As for the copper wire having a surface on which the ratio Cu[II]/Cu[I] as measured by X-ray Photoelectron Spectroscopy (XPS) falls within the range described above, it is considered that adhesion can be improved by reducing gaps between bonding interfaces and unevenness thereof by normal ultrasonic vibrations, and diffusion of Cu to a member to be bonded via the bonding interface is further accelerated, and thereby a favorable bondability can be achieved even when the number of times of scrubs, a movement amount of the scrub, and the like are reduced. In this regard, the present inventors have confirmed that variation is caused in the bondability and an expected characteristic is hardly achieved only by separately and individually controlling the percentages of Cu[I] and Cu[II] in the vicinity of the surface of the copper wire, and it is important to control the ratio Cu[II]/Cu[I].

In view of further obtaining the effect by controlling the ratio Cu[II]/Cu[I], a lower limit of the sum of Cu[I] and Cu[II] is preferably 50% or more, and more preferably 60% or more. In view of easiness of manufacturing the wire, an upper limit of this ratio is preferably 95% or less, or 90% or less.

The bondability of the copper wire is little influenced by in-plane distribution of Cu[I] and Cu[II] on the surface of the copper wire, a distribution form of Cu substances in respective states of Cu[I] and Cu[II] (particle distribution, linear distribution, in-plane distribution, and the like), and a surface morphology of the copper wire, but is greatly influenced by the ratio Cu[II]/Cu[I]. In this regard, an analytical depth of XPS analysis is about several nanometers, and no correlation has been found between the bondability and distribution of Cu[I] and Cu[II] at the analytical depth.

The present inventors have also found that, by controlling the chemical-bonding state of the Cu substances present in the vicinity of the surface of the copper wire, it is possible to achieve the copper wire that has excellent loop shape stability as well as a favorable bondability even when the scrub at the time of bonding is reduced.

At the time of forming a loop by deforming the copper wire, the wire is bent or flexed to cause a failure such as a contact with an adjacent wire. For example, a gold wire can be easily deformed (reformed), so that a loop shape such as a trapezoid or M-shape has been used for forming a loop having a long wire length (long span). However, when forming a loop having a trapezoid shape or M-shape using the copper wire, the wire may be bent or flexed. Further, at the time of forming a loop having a short wire length (short span), in a case where a height difference between a semiconductor element and a substrate is large, there may be frequently caused a loop fall, a bonding failure, and the like as for the copper wire. Thus, the loop shape is unstable with the copper wire, so that it has been concerned that production control at the time of mounting is difficult, and a yield is lowered, for example.

In a preferable embodiment of the present invention, [Cu(OH)$_2$]/[CuO] which is a ratio of a percentage of Cu(OH)$_2$ [Cu(OH)$_2$] to a percentage of CuO [CuO], measured by X-ray Photoelectron Spectroscopy (XPS), falls within a range from 1 to 5.5.

Herein, as described above, the percentage of CuO [CuO] as measured by X-ray Photoelectron Spectroscopy (XPS) indicates the percentage of Cu substances in the chemical-bonding state of CuO when the sum of percentages of Cu substances in the chemical-bonding states of Cu, Cu$_2$O, CuO and Cu(OH)$_2$ as measured by X-ray Photoelectron Spectroscopy (XPS) is defined as 100%.

Similarly, the percentage of Cu(OH)$_2$ [Cu(OH)$_2$] as measured by X-ray Photoelectron Spectroscopy (XPS) indicates the percentage of Cu substances in the chemical-bonding state of Cu(OH)$_2$ when the sum of percentages of Cu substances in the chemical-bonding states of Cu, Cu$_2$O, CuO and Cu(OH)$_2$ as measured by X-ray Photoelectron Spectroscopy (XPS) is defined as 100%.

Hereinafter, a condition related to the ratio [Cu(OH)$_2$]/[CuO] is also referred to as a "Condition 2".

When the ratio [Cu(OH)$_2$]/[CuO] falls within the range from 1 to 5.5, there can be suppressed a failure such as a fall, bending, hanging, or the like of a loop at the time of forming the loop, and the copper wire that is excellent in loop shape stability may be achieved even in a case of forming a loop having a long span or a case of forming a loop having a large height difference and a short span.

In view of achieving the copper wire that is further excellent in loop shape stability, a lower limit of the ratio [Cu(OH)$_2$]/[CuO] is more preferably 1.1 or more, and further preferably 1.2 or more, 1.3 or more, 1.4 or more, 1.5 or more, or more than 1.5.

With regard to the copper wire, it has been confirmed that a slidability between the surface of the wire and a capillary influences the stability of the loop shape. When the wire is tensioned or deformed at the time of forming the loop, the wire is rubbed at an inner wall, a tip part, and the like of the capillary. As a material of the capillary, an aluminum (Al)-based oxide is typically used, and an ordinary alumina (Al$_2$O$_3$), an alumina containing zirconium (Zr), and the like are often used. The present inventors have found that the Cu substance in the chemical-bonding state corresponding to the bivalent Cu present in the vicinity of the surface of the copper wire influences the slidability with respect to the Al-based oxide, and in particular the ratio of Cu(OH)$_2$ to CuO greatly influences it. It can be considered that a friction with the Al-based oxide is lowered when the percentage of Cu(OH)$_2$ increases, and a shaving or a hooking can be reduced by reducing the percentage of CuO.

In view of achieving the copper wire that is further excellent in loop shape stability, an upper limit of the ratio [Cu(OH)$_2$]/[CuO] is more preferably 5.4 or less, and further preferably 5.3 or less, 5.2 or less, 5.1 or less, or 5 or less.

By forming the surface on which the ratio [Cu(OH)$_2$]/[CuO] falls within the preferable range described above, there can be achieved the copper wire that is excellent in loop shape stability even at the time of forming a loop having a long span or at the time of forming a loop having a large height difference and a short span. For example, in a case of forming a trapezoid loop having a long span, a loop shape configured by a horizontal part and an inclined part of the wire can be stabilized even when the wire length is 4 mm or more. Additionally, for example, in a case of forming a loop having a large height difference and a short span, a fall or hanging of the loop can be suppressed and the loop shape can be stabilized even in a case where the wire length is 0.5 mm or less and a difference between heights of bonding parts at two points (that is, a first bonding part with an electrode on a semiconductor chip and a second bonding part with an electrode on a lead frame or a circuit board) is 0.1 mm or more.

The present inventors have also found that, by controlling the chemical-bonding state of the Cu substances present in the vicinity of the surface of the copper wire, it is possible to achieve the copper wire that exhibits a favorable bondability even when the scrub at the time of bonding is reduced and achieves a favorable capillary life.

It has been concerned that, as for the copper wire, the capillary tends to be damaged at an early stage such that a clogging thereof is caused, or adhering substances are generated. When a large number of wires are connected in a bonding process, there is caused the clogging of a hole of the capillary, the contamination of an inner wall and a tip part of the capillary, or the like. Therefore, a bonding failure may be caused, or a frequency of replacing the capillary may be increased in order to avoid such a failure. In replacing the capillary, the problems arise such as the interruption of production due to the stop of the device, the need of more operators, and the like. Furthermore, in the future, the diameter of the copper wire is required to be reduced corresponding to a need for high-density mounting, and then a gap between the capillary and the wire is reduced (a wire feeding hole is narrowed) in using a thin copper wire, so that it is concerned that a service life of the capillary is shortened.

In a preferable embodiment of the present invention, [CuO]/[Cu$_2$O] which is the ratio of the percentage of CuO [CuO] to the percentage of Cu$_2$O [Cu$_2$O] as measured by X-ray Photoelectron Spectroscopy (XPS) falls within a range from 0.3 to 6.

Herein, as described above, the percentage of Cu$_2$O [Cu$_2$O] as measured by X-ray Photoelectron Spectroscopy (XPS) indicates the percentage of Cu substances in the chemical-bonding state of Cu$_2$O when the sum of percentages of Cu substances in the chemical-bonding states of Cu, Cu$_2$O, CuO and Cu(OH)$_2$ as measured by X-ray Photoelectron Spectroscopy (XPS) is defined as 100%.

The percentage of CuO [CuO] as measured by X-ray Photoelectron Spectroscopy (XPS) is as described above in relation to the Condition 2.

Hereinafter, a condition related to the ratio [CuO]/[Cu$_2$O] is also referred to as a "Condition 3".

When the ratio [CuO]/[Cu$_2$O] falls within the range from 0.3 to 6, a service life of the capillary until the capillary is replaced (also simply referred to as a "capillary life") can be improved in a mass production process of bonding.

In view of further improving the capillary life, a lower limit of the ratio [CuO]/[Cu$_2$O] is more preferably 0.4 or more, and further preferably 0.5 or more, 0.6 or more, 0.7 or more, 0.8 or more, 0.9 or more, or 1 or more.

It is considered that two types of oxides including CuO and Cu$_2$O are related to the shaving and scratching of the capillary and the surface of the wire, the clogging of the wire feeding hole of the capillary, and the like, and thus the capillary life is influenced thereby. It is considered that CuO forms a dense film and contributes to reducing abrasion due to rubbing with the Al-based oxide which is the material of the capillary. On the other hand, it is considered that a forming speed of Cu$_2$O is relatively high, and Cu$_2$O includes a lattice defect, a void, and the like, and thus the shaving and the like are easily caused.

In this regard, the present inventors have found that the clogging, shaving, and the like of the wire feeding hole are hardly improved only by separately and individually controlling the percentages of CuO and Cu$_2$O in the vicinity of the surface of the copper wire, and the capillary life may be significantly improved by controlling both of them to control the ratio [CuO]/[Cu$_2$O].

In view of achieving an excellent capillary life and achieving a favorable low-temperature bondability, an upper limit of the ratio [CuO]/[Cu$_2$O] is more preferably 5.5 or less, and further preferably 5 or less, 4.5 or less, 4 or less, 3.8 or less, 3.6 or less, 3.5 or less, 3.4 or less, 3.2 or less, 3 or less, or 2.8 or less.

As for the copper wire according to the present invention, when the sum of percentages of Cu substances in the chemical-bonding states of Cu, Cu$_2$O, CuO and Cu(OH)$_2$ on the surface of the wire as measured by X-ray Photoelectron Spectroscopy (XPS) is defined as 100%, the percentage of Cu substances in the chemical-bonding state of Cu is preferably 5% or more, and more preferably 10% or more. An upper limit of the percentage is preferably 50% or less, and more preferably 40% or less.

The copper wire according to the present invention is composed of copper or a copper alloy. A content of copper in the wire is not limited so long as it does not inhibit the effect of the present invention. For example, the content of copper in the wire may be 95% by mass or more, and is preferably 96% by mass or more, 97% by mass or more, 98% by mass or more, 99% by mass or more, 99.2% by mass or more, 99.4% by mass or more, or 99.5% by mass or more.

The copper wire according to the present invention may further contain a dopant(s). The copper wire may contain any dopants that may improve the characteristic of the copper wire. Particularly, the copper wire preferably contains one or more selected from the group consisting of Pd, Pt, Ag and Rh. When the copper wire contains such a specific dopant(s) and satisfies the Condition 1 described above, a floor life thereof in the atmosphere can be improved.

When the entire wire is defined as 100% by mass, the copper wire according to the present invention preferably contains 100 to 6000 ppm by mass in total of one or more dopants selected from the group consisting of Pd, Pt, Ag and Rh. Accordingly, in a preferable embodiment, the copper bonding wire according to the present invention contains one or more selected from the group consisting of Pd, Pt, Ag and Rh, and a total concentration thereof is from 100 to 6000 ppm by mass.

A lower limit of a total content of the dopant in the copper wire is more preferably 150 ppm by mass or more, and further preferably 200 ppm by mass or more, 250 ppm by mass or more, or 300 ppm by mass or more. In view of improving the floor life in the atmosphere while suppressing an increase in hardness of the wire, an upper limit of the total content is more preferably 5500 ppm by mass or less, and further preferably 5000 ppm by mass or less, 4500 ppm by mass or less, 4000 ppm by mass or less, 3500 ppm by mass or less, or 3000 ppm by mass or less.

The copper bonding wire is shipped such that, after being wound around a spool to be a wound body, the wound body is sealed in a barrier bag that blocks oxygen, moisture, and the like. Then, the barrier bag is opened immediately before being subjected to connection between electrodes in manufacture of a semiconductor device. A usage time limit of the wire after the barrier bag is opened is typically assumed to be about 2 to 6 days. When the wire contains the preferred content of one or more dopants selected from the group consisting of Pd, Pt, Ag and Rh while satisfying the Condition 1, the floor life thereof in the atmosphere after the barrier bag is opened can be improved. For example, it is possible to provide the copper wire having a favorable bondability under a low scrub condition and having favorable loop shape stability even in a case where the copper wire is stored in the atmosphere for 7 days after the barrier bag is opened. Such an effect is considered to be obtained as follows. When the copper wire contains the preferred content of one or more dopant, selected from the group consisting of Pd, Pt, Ag and Rh while satisfying the ratio Cu[II]/Cu[I] of the Condition 1, a noble metal element including Pd, Pt, Ag and Rh may keep an effect of suppressing a growth of Cu$_2$O which is the monovalent Cu and accelerating a formation of the bivalent Cu for a long time while the wire is stored in the atmosphere, and thereby an effect of maintaining the ratio Cu[II]/Cu[I] in an appropriate range of the present invention is improved.

The balance, the remaining part, other than the dopant in the copper bonding wire according to the present invention may consist of copper and inevitable impurities.

A diameter of the copper bonding wire according to the present invention is not particularly limited, but may be appropriately determined depending on specific purposes. Preferably, the diameter of the copper bonding wire may be 15 μm or more, 18 μm or more, or 20 μm or more, or the like. An upper limit of the diameter is not particularly limited, but may be 200 μm or less, 150 μm or less, 100 μm or less, or the like. Thus, in an embodiment, the diameter of the copper bonding wire according to the present invention is 15 μm or more and 100 μm or less.

The copper bonding wire according to the present invention can be used for connecting an electrode on a semiconductor chip to an electrode on a lead frame or a circuit board when manufacturing the semiconductor device. First connection (1st bonding) with the electrode on the semiconductor chip may be ball bonding or wedge bonding. In the ball bonding, a tip end of the wire is heated and molten by arc heat input to form a ball (FAB: Free Air Ball) by surface tension, and then this ball part is compression-bonded onto the electrode of the heated semiconductor element. In the wedge bonding, the wire part is compression-bonded onto the electrode by applying heat, ultrasonic waves, and pressure to the wire part without forming the ball. Second connection (2nd bonding) with the electrode on the lead frame or the circuit board may be wedge bonding. The copper bonding wire according to the present invention satisfying the Condition 1 described above can exhibit a favorable bondability even when the scrub at the time of bonding is reduced. When further satisfying the Condition 2 described above, the copper bonding wire according to the present invention can achieve the excellent loop shape stability even in a case of forming a loop having a long span or a case of forming a loop having a large height difference and a short span. When satisfying the Condition 3 described above, the capillary life can be improved. In view of the above, the present invention greatly contributes to expansion of practical use of the copper wire.

<Measurement/Evaluation Method for Copper Bonding Wire by XPS>

Hereinafter, there will be described a measurement/evaluation method for the copper bonding wire by X-ray Photoelectron Spectroscopy (XPS).

—Preparation of Measurement Sample—

A measurement sample may be prepared by winding the copper wire around a sample stage. Specifically, a glass plate is prepared as the sample stage, and the copper wire is wound around the glass plate multiple times to prepare the measurement sample. In this regard, the copper wire is wound around the glass plate so that (i) the copper wire is densely wound multiple times to hide the glass plate as the sample stage, and (ii) a surface of the obtained measurement sample becomes flat. Herein, the term "flat" representing the surface of the measurement sample means that the surface of the measurement sample obtained by winding the copper wire around the sample stage multiple times does not have extreme unevenness, and is flat to be substantially parallel with a principal surface of the sample stage.

Herein, special preprocessing is not required at the time of measuring the copper wire, and a measurement may be performed on the copper wire in a state similar to the state when the copper wire is subjected to connection between electrodes in manufacturing a semiconductor device. As described above, the copper wire is shipped, after being manufactured, while being sealed in a barrier bag that blocks oxygen, moisture, and the like. Then, the barrier bag is opened before being subjected to connection between electrodes in manufacture of a semiconductor device. The barrier bag is opened in a clean room in which the semiconductor device is manufactured, and the floor life of the copper wire after the barrier bag is opened is typically about 2 to 6 days. Therefore, the copper wire may be subjected to the measurement before 3 days elapses in the clean room or an environment equivalent thereto after the barrier bag is opened. Preferably, the measurement sample is prepared immediately after the barrier bag is opened (for example, within 3 hours, within 2 hours, within 1 hour, within 30 minutes), and the measurement sample is placed in a vacuum atmosphere of XPS measurement device to rapidly perform XPS measurement.

—Measurement and Evaluation by XPS—

The obtained measurement sample is subjected to a measurement by XPS, and spectra of Cu2p3/2, CuLMM, and O1s are obtained. Herein, Cu2p3/2 is a spectrum derived from electrons (photoelectrons) of a 2p3/2 orbit of Cu, and CuLMM is a spectrum derived from Auger electrons related to LMM transition of Cu. O1s is a spectrum derived from electrons of a 1s orbit of oxygen (O).

The measurement by XPS can be performed under a condition described in [Measurement and evaluation of copper bonding wire by XPS] described later. A measurement region (detection target region) of XPS is preferably a region having a diameter of at least 100 μm, and the number of measurement points is preferably 2 or more. The percentages of Cu substances in the respective chemical-bonding states described above including the Conditions 1 to 3 are based on a result obtained by measuring a measurement area equal to or larger than the above value.

Next, the detected spectrum is analyzed. The spectra are analyzed by waveform analysis using an analysis software attached to the XPS device, and waveforms are separated for each of the chemical-bonding states of Cu. A percentage for each chemical-bonding state of Cu can be calculated in accordance with procedures (1) to (3) described below.

(1) By using the Cu2p3/2 spectrum, a total waveform of Cu[0]+Cu[I] is separated from a waveform of Cu[II], and respective percentages thereof are obtained.

(2) By using the CuLMM spectrum, a waveform of Cu[0] is separated from a waveform of Cu[I], and respective percentages thereof are obtained.

(3) By using the O1s spectrum, a waveform of CuO is separated from a waveform of Cu(OH)$_2$, and respective percentages thereof are obtained. The percentage of O2 components (derived from Cu$_2$O) of the O1s spectrum is adjusted to be 1/2 (half) of the percentage of Cu[I].

<Manufacturing Method for Copper Bonding Wire>

There will be described an example of a method for manufacturing the copper bonding wire according to the present invention.

Raw material copper having a purity of 3 N to 6 N (99.9 to 99.9999% by mass) is processed to have a large diameter by continuous casting, and subsequently, thinned to have a final wire diameter by wire drawing.

In a case of adding a dopant, a copper alloy containing a required concentration of dopant may be used as a raw material. In a case of adding a dopant, a dopant component having high purity may be directly added, or a mother alloy containing a dopant component at a concentration of about 1% may be used. Alternatively, a dopant component may be attached to a surface of the wire during the wire manufacturing process to be contained therein. In this case, this process may be incorporated in any process of the wire manufacturing process, or may be incorporated in a plurality of processes. A deposition method can be selected from among (1) application of aqueous solution, drying, and then heat treatment, (2) a plating method (wet), and (3) a vapor deposition method (dry).

The wire drawing process can be performed by using a continuous wire drawing machine in which a plurality of diamond-coated dies can be set. If necessary, heat treatment may be performed during the wire drawing process. After the wire drawing process, heat treatment is performed.

—Control of Ratio Cu[II]/Cu[I]—

There will be described a preferable condition of the heat treatment and a surface property before the heat treatment, in view of achieving the copper bonding wire in which the ratio Cu[II]/Cu[I] as measured by X-ray Photoelectron Spectroscopy (XPS) falls within a predetermined range.

In a heat treatment process of the copper wire, a heating speed and a cooling speed of the wire are preferably increased at the same time by using a method of continuously heating the copper wire while sweeping the copper wire into a heating furnace. That is, in view of controlling Cu[II]/Cu[I] which is the ratio of valences of Cu on the surface of the copper wire to fall within a predetermined range, the copper wire is preferably rapidly heated and rapidly cooled in the heat treatment process.

Specifically, when a maximum temperature in the heating furnace is defined as T (° C.), and a moving time from an inlet of the heating furnace to a maximum temperature region in the furnace is defined as H (second), a temporary (apparent) rate of temperature rising is represented as T/H (°

C./second). Regarding the cooling rate, when a moving time from the maximum temperature region in the furnace to an outlet of the heating furnace is defined as C (second), a temporary (apparent) cooling rate is represented as T/C (° C./second). The temporary rate of temperature rising T/H is preferably 400° C./second or more, and more preferably 500° C./second or more, or 600° C./second or more. An upper limit of T/H is not limited, but may be 2000° C./second or less, or 1500° C./second or less, for example. The temporary cooling rate T/C is preferably 500° C./second or more, and more preferably 600° C./second or more, or 700° C./second or more. An upper limit of T/C is not limited, but may be 3000° C./second or less, 2500° C./second or less, or 2000° C./second or less, for example. As a method of achieving the temporary rate of temperature rising and the temporary cooling rate, it is preferable to optimize, for example, a flow rate of atmospheric gas, a position of an insertion port for atmospheric gas, or a length, a diameter and a shape of an atmospheric gas circulating pipe in the furnace, and a shape, a length, a position, a setting temperature and the like of a heater part. For example, in order to raise the temporary rate of temperature rising, there may be used a method of installing the heater part in the vicinity of the inlet of the heating furnace and raising the setting temperature thereof. In order to raise the temporary cooling rate, there may be used a method of increasing the flow rate of the atmospheric gas on a cooling side. By controlling the maximum temperature T in the heating furnace to fall within a range from 400 to 900° C. in addition to setting the rate of temperature rising and the cooling rate in the heat treatment process to fall within the preferable range described above, the stability of oxide, hydroxide, and the like on the surface of the copper wire are changed, and then the ratio Cu[II]/Cu[I] may be advantageously adjusted to fall within a range from 0.8 to 12. Preferably, by setting the temporary rate of temperature rising T/H to be 600° C./second or more, and setting the temporary cooling rate T/C to be 700° C./second or more, it contributes to adjust the ratio Cu[II]/Cu[I] to fall within a preferable range from 2 to 10.

In view of controlling the ratio Cu[II]/Cu[I] to fall within the predetermined range, it is also preferable to reduce organic matters adhering to and remaining on the surface of the copper wire in the wire drawing process. In the wire drawing process of the copper wire, a lubricant based on water and oil is usually used for reducing friction between the copper wire and a surface of die. By using an oil-based lubricant that can easily volatilize at the time of heat treatment such as a lubricant having low-molecular weight and a low melting point, the percentage of the monovalent Cu can be adjusted by accelerating generation of the bivalent Cu. It is inferred that such an effect is influenced by that a protective function of the surface of the copper wire is enhanced by the bivalent Cu (Cu substance corresponding thereto) and that the proceeding of oxidation may be suppressed by controlling the monovalent Cu.

—Control of Ratio [Cu(OH)$_2$]/[CuO]—

In order to control the ratio [Cu(OH)$_2$]/[CuO], it is preferable to water-cool the wire in the vicinity of the outlet of the heating furnace in addition to the condition of the heat treatment of rapid heating and rapid cooling described above.

It can be considered that the ratio [Cu(OH)$_2$]/[CuO] can be advantageously adjusted to fall within a predetermined range by increasing the cooling rate using the water cooling as compared with air cooling to suppress the formation of CuO, and by passing the copper wire through water at a high temperature to accelerate the formation of Cu(OH)$_2$. By optimizing a cooling time, a water temperature, a distance from the outlet of the heating furnace to cooling water, and the like at the time of water cooling, the ratio [Cu(OH)$_2$]/[CuO] can be adjusted within the preferable range described above. The water used for water cooling may contain a small amount of surfactant. By using the surfactant, there may be improved a disentangling property of the copper wire at the time of using the copper wire.

—Control of Ratio [CuO]/[Cu$_2$O]—

In order to control the ratio [CuO]/[Cu$_2$O], it is preferable to optimize a partial pressure of oxygen and an amount of water vapor in gas atmosphere used for the heat treatment process in addition to the condition of heat treatment of rapid heating and rapid cooling described above.

As the partial pressure of oxygen is higher and the amount of water vapor is larger, the formation of CuO is accelerated, and the ratio [CuO]/[Cu$_2$O] tends to be increased.

[Semiconductor Device]

The semiconductor device can be manufactured by connecting the electrode on the semiconductor chip to the electrode on the lead frame or the circuit board by using the copper bonding wire for semiconductor devices according to the present invention.

In an embodiment, the semiconductor device according to the present invention includes a circuit board, a semiconductor chip, and a copper bonding wire for electrically connecting the circuit board and the semiconductor chip with each other, and is characterized in that the copper bonding wire is the copper bonding wire according to the present invention.

In the semiconductor device according to the present invention, the circuit board and the semiconductor chip are not particularly limited, and a known circuit board and semiconductor chip that may be used for constituting the semiconductor device may be used. Alternatively, a lead frame may be used in place of the circuit board. For example, like the semiconductor device disclosed in JP 2002-246542 A, the semiconductor device may include a lead frame and a semiconductor chip mounted on the lead frame.

Examples of the semiconductor device may include various semiconductor devices used for electric products (for example, a computer, a cellular telephone, a digital camera, a television, an air conditioner, a solar power generation system), vehicles (for example, a motorcycle, an automobile, an electric train, a ship, and an aircraft), and the like.

EXAMPLES

There will be specifically described the present invention with Examples. However, the present invention is not limited to the Examples described below.

(Sample)

First, the method of preparing a sample will be described. For Cu as a raw material of the wire, Cu having a purity of 99.9% by mass or more (3 N) to 99.999% by mass or more (5 N) with the balance composed of inevitable impurities was used. The copper having such a given purity was subjected to continuous casting to manufacture the wire material having a wire diameter of several millimeters. In a case of adding dopants Pd, Pt and Ag, the dopants Pd, Pt and Ag having a purity of 99% by mass or more with the balance being composed of inevitable impurities were used, or alternatively a mother alloy of Cu with a high concentration of the dopants was used. The dopants were added to the copper having the given purity described above so that the content of the dopants therein reaches a desired value, and then the wire material was manufactured by continuous casting so as to have a wire diameter of several millimeters. The resultant wire material was drawn to manufacture the wire having a diameter of 0.3 to 1.4 mm. In the wire drawing, a commercially available lubricant was used, and the wire drawing rate was 30 to 200 m/min. Also, in the wire drawing, the wire drawing process was performed using a plurality of dies having an area reduction ratio of a range from 10 to 26% (at least half of all the dies had an area reduction ratio of 10 to 21%), and the wire was processed to have a final wire diameter. During the wire drawing process, heat treatment was performed 0 to 2 times at 200 to 600° C. for 5 to 15 seconds as needed. The final wire diameter was a diameter of 20 μm.

After the wire drawing process, the wire was continuously heated while being swept into a heat treatment furnace. The maximum temperature in the furnace was 400 to 850° C., and the heat treatment was performed under a flow of $N_2$+5% $H_2$ gas in the furnace. When the maximum temperature in the furnace is defined as T (° C.), a moving time from the furnace inlet to the maximum temperature region in the furnace is defined as H (second), and a moving time from the maximum temperature region in the furnace to the furnace outlet is defined as C (second), the temporary (apparent) rate of temperature rising is represented as T/H (° C./second), and the temporary cooling rate is represented as T/C (° C./second). In Examples, the temporary rate of temperature rising T/H was set to be within a range from 400 to 1500° C./second, and the temporary cooling rate T/C was set to be within a range from 500 to 2000° C./second. In Comparative Examples, T/H is set to be lower than 400° C./second and T/C is set to be lower than 500° C./second, which is an example of a ordinary condition for manufacturing the copper bonding wire.

(Test and Evaluation Methods)

There will be described test and evaluation methods.

[Measurement and Evaluation of Copper Bonding Wire by XPS]

1. Preparation of Measurement Sample

The copper bonding wire manufactured in Examples and Comparative Examples was sealed in a bag with nitrogen atmosphere using a commercially available barrier bag, and the bag was opened within one week thereafter. The measurement sample described below was prepared within 2 days after the bag was opened, and the measurement sample was put into a vacuum chamber of the XPS device. The copper bonding wire was wound around a glass plate having a width of 10 mm to prepare the measurement sample. In preparing the measurement sample, the copper bonding wire was wound around the glass plate so that (i) the wire is densely wound multiple times to hide the glass, and (ii) a surface of the obtained measurement sample becomes flat.

2. Measurement and Evaluation by XPS

XPS measurement was performed on the measurement sample obtained in 1. described above under the following conditions, and spectra of $Cu_2p3/2$, CuLMM, and O1s were detected.

Measurement device: QuanteraII manufactured by ULVAC-PHI, Inc.
Ultimate vacuum: about $1×10^{-8}$ Torr
X-ray source: monochromatic Al (1486.6 eV)
X-ray beam diameter: 100 μmφ (25 W, 15 kV)
Detection region: 10000 μm²
Photoelectron extraction angle: 45 degrees The detected spectra were analyzed by waveform analysis using an analysis software attached to the XPS device, and waveforms were separated for each of the chemical-bonding states of Cu. The percentage for each chemical-bonding state of Cu was calculated in accordance with the following procedures (1) to (3).

(1) By using the $Cu_2p3/2$ spectrum, a total waveform of Cu[0]+Cu[I] is separated from a waveform of Cu[II], and respective percentages thereof are obtained.
(2) By using the CuLMM spectrum, a waveform of Cu[0] is separated from a waveform of Cu[I], and respective percentages thereof are obtained.
(3) By using the O1s spectrum, a waveform of CuO is separated from a waveform of Cu(OH)$_2$, and respective percentages thereof are obtained. The percentage of 02 components (derived from $Cu_2O$) of the O1s spectrum is adjusted to be ½ of the percentage of Cu[I].

[Performance Test and Evaluation of Copper Bonding Wire]

With regard to the respective wires manufactured in Examples and Comparative Examples, bonding was performed using a commercially available wire bonder (IConn manufactured by Kulicke and Soffa Industries, Inc.). A Cu alloy lead frame plated with Ag was used as a lead frame, and a chip using Si was used as a semiconductor element. The lead frame plated with Ag described above was used as an electrode. Ball bonding was performed with respect to the semiconductor element, and wedge bonding was performed with respect to the lead frame. Ball formation was performed under a flow of $N_2$+5% $H_2$ gas at a flow rate of 0.4 L/min or more and smaller than 0.6 L/min.

<Scrub Evaluation>

In scrub evaluation, the wire was bonded by reducing the number of times of scrubs at the time of wedge bonding to 1 time or 0 (zero) time (without a scrub), which is usually required to be 2 times or more. A bonding temperature was set to be low, specifically, at 150° C., a load condition at the time of bonding was adjusted in a range from 50 to 80 gf, and a setting value of USG Current was adjusted in a range from 15 to 40 as for a condition of ultrasonic vibrations. Regarding the scrub conditions, a scrub amplitude was set to be within a range from 2.5 to 3.5 μm, and a scrub frequency was adjusted in a range from 170 to 250 kHz. As a scrub mode, in-line was selected, and a scrub moving direction was parallel with a wire direction. 200 wires were bonded. The number of wires with which a bonding failure, such as a non-bonding that causes detachment at the time of bonding or a stop of the wire bonder, occurs was counted. With regard to the respective wires, the test was performed two times to obtain an average value of the number of wires causing a bonding failure, and evaluation was performed in accordance with the following criteria. Evaluation results are shown in the column of "Bondability" in Table 1.

Evaluation Criteria:
◎: 0
○: 1 to 3
Δ: 4 to 6
x: 7 or more

<Loop Shape Stability>

For the trapezoid loop having a long span and the loop having a large height difference and a short span, the loop shape stability (reproducibility of a loop profile) was tested and evaluated as follows.

(1) Loop Shape Stability at Time of Forming Trapezoid Loop Having a Long Span 144 trapezoid loops were connected so as to achieve a wire length of 5 mm and a loop height of 0.4 mm as a severer condition than an ordinary condition of loop formation. A loop portion was observed with an optical microscope. A failure was determined if a bending amount was 0.2 mm or more, and evaluation was performed in accordance with the following criteria. The bending amount was obtained by connecting two bonding parts with a straight line, and obtaining a distance between a maximum bending part and the straight line. Evaluation results are shown in the column of "Trapezoid having long span" in "Loop shape stability" in Table 1.

Evaluation Criteria:
⊚: No failure part
○: 1 to 3 failure parts
Δ: 4 to 7 failure parts
x: 8 or more failure parts (2) Loop Shape Stability at Time of Forming Loop Having Large Height Difference and Short Span 200 loops having a large height difference were connected so that the wire length was 0.6 mm and a height difference between a wedge bonding part and a ball bonding part was 0.5 mm. A loop portion was observed with an optical microscope. A failure was determined if the bending amount was 0.05 mm or more, and evaluation was performed in accordance with the following criteria. Evaluation results are shown in the column of "Large height difference and short span" in "Loop shape stability" in Table 1.

Evaluation Criteria:
⊚: No failure part
○: 1 to 3 failure parts
Δ: 4 to 7 failure parts
x: 8 or more failure parts connected under the condition that the bonding temperature was 150° C. and the number of times of scrubs was 2. Subsequently, the capillary was removed from the wire bonder, and the capillary was observed with an optical microscope. The number of capillaries including 3 μm or more size of contamination, adhering substances, shavings, and the like at a tip part and an inner part thereof was counted as the number of failures, and evaluation was performed in accordance with the following criteria. Evaluation results are shown in the column of "50,000 bonds" in "Capillary life" in Table 1.

Evaluation Criteria:
⊚: 0 failure
○: 1 failure
Δ: 2 failures
x: 3 or more failures Evaluation was also made with respect to a case of connecting 200,000 trapezoid loops under the same condition as described above. Evaluation results are shown in the column of "200,000 bonds" in "Capillary life" in Table 1.

Evaluation Criteria:
⊚: 0 failure
○: 1 to 2 failures
Δ: 3 to 4 failures
x: 5 or more failures Evaluation results of Examples and Comparative Examples are shown in Table 1.

TABLE 1

| | | Cu purity | Dopant | XPS | | | Bondability | | Loop shape stability | | Capillary life | |
|---|---|---|---|---|---|---|---|---|---|---|---|---|
| | No. | % by mass | ppm by mass | Cu[II]/Cu[I]*1 | [Cu(OH)₂]/[CuO]*2 | [CuO]/[Cu₂O]*3 | One time of scrub | 0 times of (no) scrub | Trapezoid having long span | Large height difference and short span | 50,000 bonds | 200,000 bonds |
| Working Example | 1 | 99.99 | — | 2.05 | 2.59 | 0.57 | ⊚ | ⊚ | ⊚ | ⊚ | ⊚ | ○ |
| | 2 | 99.99 | — | 8.71 | 3.16 | 2.10 | ⊚ | ⊚ | ⊚ | ⊚ | ⊚ | ⊚ |
| | 3 | 99.99 | — | 1.31 | 4.86 | 0.22 | ⊚ | ⊚ | ⊚ | ⊚ | ○ | Δ |
| | 4 | 99.99 | — | 4.47 | 2.94 | 1.13 | ⊚ | ⊚ | ⊚ | ⊚ | ⊚ | ⊚ |
| | 5 | 99.99 | — | 0.93 | 2.00 | 0.31 | ⊚ | ○ | ⊚ | ⊚ | ⊚ | ○ |
| | 6 | 99.99 | — | 11.72 | 0.96 | 5.98 | ⊚ | ○ | ⊚ | Δ | ⊚ | ⊚ |
| | 7 | 99.99 | — | 7.00 | 1.52 | 2.78 | ⊚ | ⊚ | ⊚ | ⊚ | ⊚ | ⊚ |
| | 8 | 99.99 | — | 9.69 | 1.03 | 4.77 | ⊚ | ⊚ | ⊚ | ○ | ⊚ | ⊚ |
| | 9 | 99.999 | — | 2.19 | 5.13 | 0.36 | ⊚ | ⊚ | ⊚ | ○ | ⊚ | ○ |
| | 10 | 99.99 | — | 8.76 | 1.80 | 3.13 | ⊚ | ○ | ⊚ | ⊚ | ⊚ | ⊚ |
| | 11 | 99.99 | — | 3.94 | 2.55 | 1.11 | ⊚ | ⊚ | ⊚ | ⊚ | ⊚ | ⊚ |
| | 12 | 99.99 | — | 5.75 | 0.97 | 2.92 | ⊚ | ○ | ○ | Δ | ⊚ | ⊚ |
| | 13 | 99.999 | Ag 300 | 4.47 | 2.94 | 1.13 | ⊚ | ○ | ⊚ | ⊚ | ⊚ | ○ |
| | 14 | 99.99 | Ag 800 | 2.19 | 5.76 | 0.32 | ⊚ | ⊚ | ⊚ | Δ | ⊚ | ⊚ |
| | 15 | 99.99 | Pd 1000 | 2.58 | 3.08 | 0.63 | ⊚ | ⊚ | ⊚ | ⊚ | ⊚ | ⊚ |
| | 16 | 99.99 | Pt 6000 | 6.20 | 1.58 | 2.40 | ⊚ | ⊚ | ⊚ | ⊚ | ⊚ | ⊚ |
| Comparative Example | 1 | 99.99 | — | 0.67 | 1.29 | 0.29 | X | X | X | X | Δ | X |
| | 2 | 99.99 | — | 0.44 | 1.20 | 0.20 | X | X | X | X | Δ | X |
| | 3 | 99.99 | — | 0.56 | 2.41 | 0.16 | X | X | X | X | Δ | X |
| | 4 | 99.99 | — | 0.56 | 0.71 | 0.33 | X | X | X | X | X | X |

*1 Cu[II]/Cu[I] is the ratio of the total percentage of Cu substances in chemical-bonding state of CuO and Cu(OH)₂ (Cu[II]) to the percentage of Cu substances in chemical-bonding state of Cu₂O (Cu[I]), when the sum of percentages of Cu substances in chemical-bonding state of Cu, Cu₂O, CuO and Cu(OH)₂ as measured by XPS is defined as 100%.
*2 [Cu(OH)₂]/[CuO] is the ratio of percentage of Cu substances in chemical-bonding state of Cu(OH)₂ [Cu(OH)₂] to ther perecentage of Cu substances in chemical-bonding state of CuO [CuO], when the sum of percentages of Cu substances in chemical-bonding state of Cu, Cu₂O, CuO and Cu(OH)₂ as measured by XPS is defined as 100%.
*3 [CuO]/[Cu₂O] is the ratio of percentage of Cu substances in chemical-bonding state of CuO [CuO] to the percentage of Cu substances in chemical-bonding state of Cu₂O [Cu₂O], when the sum of percentages of Cu substances in chemical-bonding state of Cu, Cu₂O, CuO and Cu(OH)₂ as measured by XPS is defined as 100%.

[Capillary Life]

In order to perform a bonding test for accelerating contamination and clogging of the capillary, a capillary having a small hole diameter of 25 μm was used, and 50,000 trapezoid loops having a wire length of 1.5 mm were Regarding all of Examples Nos. 1 to 16, the ratio Cu[II]/Cu[I] as measured by XPS falls within the range of the present invention, and it was confirmed that a favorable bondability was exhibited even when the scrub was reduced such that the number of times of scrubs at the time of bonding was 1 or 0. The sum of Cu[I] and Cu[II] as measured by XPS was 50% or more in all of Examples.

Additionally, regarding Examples Nos. 1 to 5, 7 to 11, 13, 15 and 16, the ratio [Cu(OH)$_2$]/[CuO] as measured by XPS falls within the preferred range, and it was confirmed that excellent loop shape stability was achieved even at the time of forming a loop having a long span or at the time of forming a loop having a large height difference and a short span.

Regarding Examples Nos. 1, 2, and 4 to 16, the ratio [CuO]/[Cu$_2$O] as measured by XPS falls within the preferred range, and it was confirmed that an excellent capillary life was achieved.

On the other hand, regarding Comparative Examples Nos. 1 to 4, the ratio Cu[II]/Cu[I] as measured by XPS was out of the range of the present invention, a bonding failure was caused when the scrub is reduced such that the number of times of scrubs at the time of bonding was 1 or 0, and the loop shape stability and the capillary life were also unfavorable.

The invention claimed is:

1. A copper bonding wire a surface of which comprising: Cu, Cu$_2$O, CuO, and Cu(OH)$_2$,
    wherein a sum of percentages of Cu, Cu$_2$O, CuO and Cu(OH)$_2$ on the surface of the copper bonding wire as measured by X-ray Photoelectron Spectroscopy (XPS) is defined as 100%, and
    wherein a ratio Cu[II]/Cu[I], which is a ratio of a total percentage of CuO and Cu(OH)$_2$ (Cu[II]) corresponding to bivalent Cu to a percentage of Cu$_2$O (Cu[I]) corresponding to monovalent Cu, falls within a range from 0.8 to 12.

2. The copper bonding wire according to claim 1, wherein a ratio [Cu(OH)$_2$]/[CuO], which is a ratio of a percentage of Cu(OH)$_2$ [Cu(OH)$_2$] to a percentage of CuO [CuO] measured by the X-ray Photoelectron Spectroscopy (XPS), falls within a range from 1 to 5.5.

3. The copper bonding wire according to claim 1, wherein a ratio [CuO]/[Cu$_2$O], which is a ratio of a percentage of CuO [CuO] to a percentage of Cu$_2$O [Cu$_2$O] measured by the X-ray Photoelectron Spectroscopy (XPS), falls within a range from 0.3 to 6.

4. The copper bonding wire according to claim 1, wherein a sum of the Cu[I] and the Cu[II] is 50% or more.

5. The copper bonding wire according to claim 1, containing one or more selected from the group consisting of Pd, Pt, Ag and Rh, and a total concentration thereof is from 100 to 6000 ppm by mass.

6. The copper bonding wire according to claim 1, wherein a diameter of the copper bonding wire is 15 μm or more and 100 μm or less.

7. The copper bonding wire according to claim 1 which is usable for a semiconductor device.

* * * * *